US010276346B1

(12) United States Patent
Duffy et al.

(10) Patent No.: US 10,276,346 B1
(45) Date of Patent: Apr. 30, 2019

(54) PARTICLE BEAM INSPECTOR WITH INDEPENDENTLY-CONTROLLABLE BEAMS

(71) Applicant: KLA-Tencor Corporation, Milpitas, CA (US)

(72) Inventors: Brian Duffy, San Jose, CA (US); Amir Azordegan, Santa Clara, CA (US); Christopher Sears, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/281,934

(22) Filed: Sep. 30, 2016

Related U.S. Application Data

(60) Provisional application No. 62/305,649, filed on Mar. 9, 2016.

(51) Int. Cl.
*H01J 37/28* (2006.01)
*H01J 37/244* (2006.01)
*H01J 37/147* (2006.01)

(52) U.S. Cl.
CPC ............ *H01J 37/28* (2013.01); *H01J 37/147* (2013.01); *H01J 37/244* (2013.01); *H01J 2237/24495* (2013.01); *H01J 2237/2801* (2013.01); *H01J 2237/2817* (2013.01)

(58) Field of Classification Search
CPC .. H01J 37/00; H01J 37/02; H01J 37/05; H01J 37/06; H01J 37/061; H01J 37/073; H01J 37/147; H01J 37/1472; H01J 37/1474; H01J 37/1475; H01J 37/1477; H01J 37/15; H01J 37/153; H01J 37/21; H01J 37/22; H01J 37/222; H01J 37/226; H01J 37/244; H01J 37/26; H01J 37/261; H01J 37/28; H01J 37/304
USPC .......................................... 250/306, 307, 311
See application file for complete search history.

(56) References Cited

U.S. PATENT DOCUMENTS

| | | | |
|---|---|---|---|
| 4,992,661 A * | 2/1991 | Tamura | ................ B82Y 15/00 250/307 |
| 6,154,714 A | 11/2000 | Lepejian | |
| 6,509,197 B1 | 1/2003 | Satya et al. | |
| 6,528,818 B1 | 3/2003 | Satya et al. | |
| 6,529,621 B1 | 3/2003 | Glasser et al. | |
| 6,576,923 B2 | 6/2003 | Satya et al. | |
| 6,636,064 B1 | 10/2003 | Satya et al. | |
| 6,691,052 B1 | 2/2004 | Maurer | |
| 6,748,103 B2 | 6/2004 | Glasser et al. | |
| 6,774,646 B1 | 8/2004 | Han et al. | |
| 6,803,571 B1 | 10/2004 | Mankos et al. | |
| 6,920,596 B2 | 7/2005 | Sagatelian et al. | |
| 6,921,672 B2 | 7/2005 | Satya et al. | |
| 6,930,309 B1 | 8/2005 | Mankos et al. | |

(Continued)

*Primary Examiner* — Jason L McCormack
(74) *Attorney, Agent, or Firm* — Suiter Swantz pc llo

(57) ABSTRACT

A multi-beam inspection system includes one or more particle beam sources to generate two or more particle beams, a set of particle control elements configured to independently direct the two or more particle beams to a sample, one or more detectors positioned to receive particles emanating from the sample in response to the two or more particle beams, and a controller communicatively coupled to the one or more detectors. The controller includes one or more processors to generate two or more inspection datasets associated with the particles received by the one or more detectors.

41 Claims, 9 Drawing Sheets

(56) References Cited

U.S. PATENT DOCUMENTS

| | | |
|---|---|---|
| 6,948,141 B1 | 9/2005 | Satya et al. |
| 6,966,047 B1 | 11/2005 | Glasser |
| 6,995,393 B2 | 2/2006 | Weiner et al. |
| 7,217,924 B1 | 5/2007 | Mankos et al. |
| 7,391,033 B1 | 6/2008 | Adler |
| 7,570,796 B2 | 8/2009 | Zafar et al. |
| 7,676,077 B2 | 3/2010 | Kulkarni et al. |
| 8,041,103 B2 | 10/2011 | Kulkarni et al. |
| 8,112,241 B2 | 2/2012 | Xiong |
| 8,126,255 B2 | 2/2012 | Bhaskar et al. |
| 8,194,968 B2 | 6/2012 | Park et al. |
| 8,258,474 B1 * | 9/2012 | Mankos .................. H01J 37/04 250/306 |
| 8,362,425 B2 | 1/2013 | Han et al. |
| 8,455,838 B2 | 6/2013 | Shadman et al. |
| 8,611,639 B2 | 12/2013 | Kulkarni et al. |
| 8,664,594 B1 | 4/2014 | Jiang et al. |
| 8,692,204 B2 | 4/2014 | Kojima et al. |
| 8,698,093 B1 | 4/2014 | Gubbens et al. |
| 8,716,662 B1 | 5/2014 | MacDonald et al. |
| 9,213,060 B2 | 12/2015 | Cote et al. |
| 9,222,895 B2 | 12/2015 | Duffy et al. |
| 2002/0015143 A1* | 2/2002 | Yin .................. G21K 1/087 355/133 |
| 2002/0070340 A1* | 6/2002 | Veneklasen .......... H01J 37/256 250/310 |
| 2003/0132382 A1* | 7/2003 | Sogard .................. G01N 23/04 250/311 |
| 2007/0029506 A1* | 2/2007 | Zywno .................. B82Y 10/00 250/491.1 |
| 2008/0230697 A1* | 9/2008 | Tanimoto ............ G01N 23/225 250/310 |
| 2010/0320382 A1* | 12/2010 | Almogy .................. H01J 37/05 250/307 |
| 2014/0103201 A1* | 4/2014 | Kramer .................. G21K 1/093 250/252.1 |
| 2014/0353498 A1* | 12/2014 | Shur .................. H01J 37/28 250/307 |
| 2015/0060662 A1* | 3/2015 | Chen .................. H01J 37/145 250/307 |
| 2015/0090879 A1* | 4/2015 | Zeidler .................. H01J 37/28 250/307 |

* cited by examiner

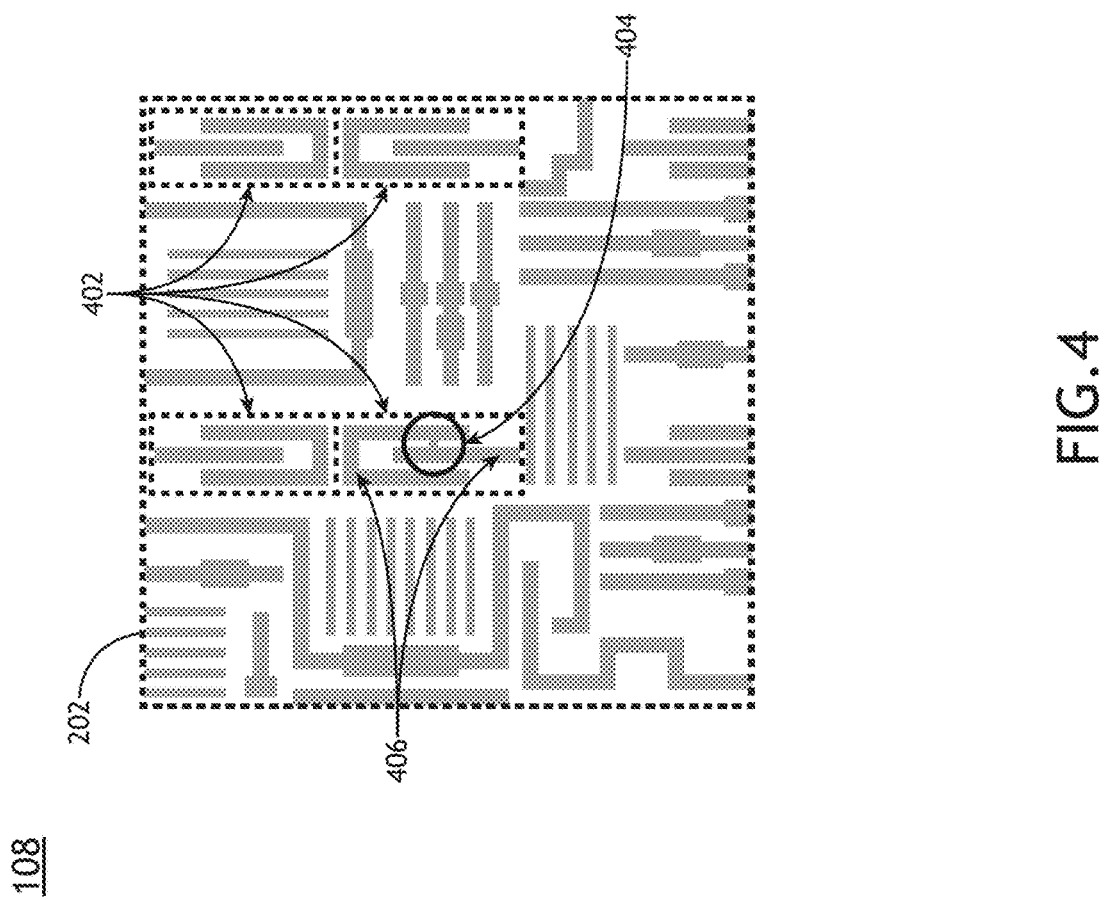

PARTICLE BEAM INSPECTOR WITH INDEPENDENTLY-CONTROLLABLE BEAMS

CROSS-REFERENCE TO RELATED APPLICATION

The present application claims the benefit under 35 U.S.C. § 119(e) of U.S. Provisional Application Ser. No. 62/305,649, filed Mar. 9, 2016, entitled MULTI-ENERGY EBEAM INSPECTOR/VOLTAGE CONTRAST TESTER WITH COMPATIBLE ALIGNMENT AND TEST STRUCTURES, naming Brian Duffy and Amir Azordegan as inventors, which is incorporated herein by reference in the entirety.

TECHNICAL FIELD

The present disclosure generally relates to defect detection, and, more particularly, to defect detection using multiple independently-controllable particle beams.

BACKGROUND

Inspection systems identify and classify defects on semiconductor wafers to generate a defect population on a wafer. A given semiconductor wafer may include hundreds of chips, each chip containing thousands of components of interest, and each component of interest may have millions of instances on a given layer of a chip. As a result, inspection systems may generate vast numbers of data points (e.g. hundreds of billions of data points for some systems) on a given wafer. Further, the demand for ever-shrinking devices leads to increased demands on inspection systems. The demands include the need for increased resolution and capacity necessary to infer the root causes of identified defects without sacrificing inspection speed or accuracy. Therefore, it would be desirable to provide a system and method for curing shortcomings such as those identified above.

SUMMARY

A multi-beam inspection system is disclosed in accordance with one or more illustrative embodiments of the present disclosure. In one illustrative embodiment, the system includes one or more particle beam sources to generate two or more particle beams. In another illustrative embodiment, the system includes set of particle control elements to independently direct the two or more particle beams to a sample. In another illustrative embodiment, the system includes one or more detectors positioned to receive particles emanating from the sample in response to the two or more particle beams. In another illustrative embodiment, the system includes a controller communicatively coupled to the one or more detectors. In another illustrative embodiment, the controller includes one or more processors to execute program instructions configured to cause the one or more processors to generate two or more inspection datasets associated with the particles received by the one or more detectors.

A multi-beam inspection system is disclosed in accordance with one or more embodiments of the present disclosure. In one illustrative embodiment, the system includes one or more particle beam sources to generate a first particle beam and a second particle beam. In another illustrative embodiment, the system includes set of particle control elements to direct the first particle beam to an alignment target on a sample, wherein the set of particle control elements are further configured to direct the second particle beam to one or more structures on the sample. In another illustrative embodiment, the system includes one or more detectors positioned to receive particles emanating from the sample in response to the two particle beams. In another illustrative embodiment, the system includes a controller communicatively coupled to the one or more detectors. In another illustrative embodiment, the controller includes one or more processors to execute program instructions. In another illustrative embodiment, the one or more control instructions cause the controller to generate, based on the particles received by the one or more detectors, a first dataset associated with the alignment target. In another illustrative embodiment, the one or more control instructions cause the controller to determine one or more alignment metrics based on the first dataset. In another illustrative embodiment, the one or more control instructions cause the controller to generate, based on the particles received by the one or more detectors and the one or more alignment metrics, a second dataset associated with the one or more structures on the sample.

A method for inspecting a sample is disclosed in accordance with one or more illustrative embodiments of the present disclosure. In one illustrative embodiment, the method includes generating two or more particle beams. In another illustrative embodiment, the method includes directing the two or more particle beams to the sample. In another illustrative embodiment, the method includes controlling the location of the two or more particle beams independently on the sample. In another illustrative embodiment, the method includes receiving particles emanating from the sample in response to the two or more particle beams. In another illustrative embodiment, the method includes generating, based on the particles emanating from the sample captured by the one or more detectors, two or more inspection datasets.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 4 is a conceptual diagram illustrating a set of structures in a care area suitable for inspection with an inspection system including multiple independently controllable beams, in accordance with one or more embodiments of the present disclosure.

DETAILED DESCRIPTION

Figure 1A:
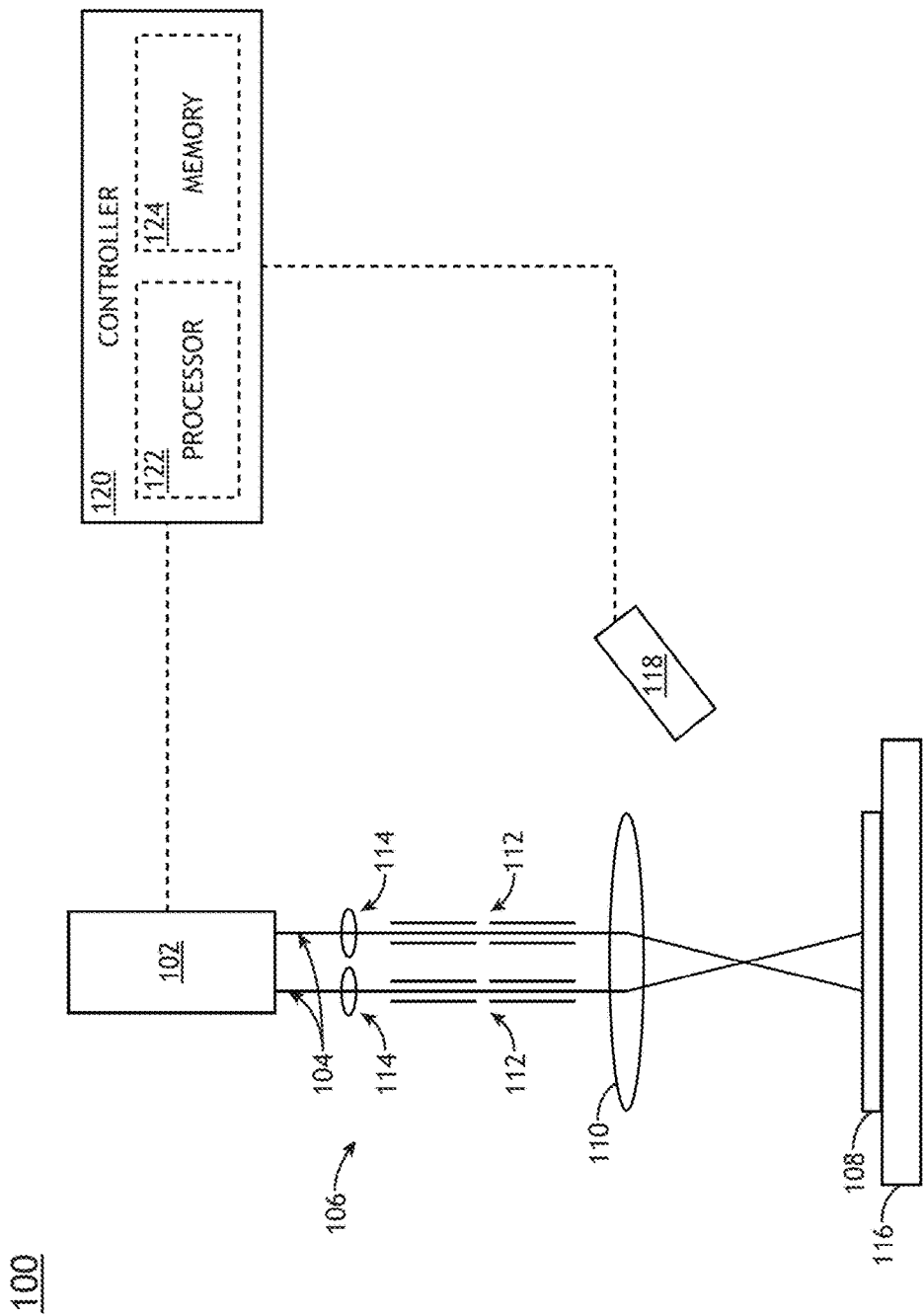
FIG. 1A is a simplified schematic view of an inspection system with multiple independently-controllable particle beams, in accordance with one or more embodiments of the present disclosure.

Reference will now be made in detail to the subject matter disclosed, which is illustrated in the accompanying drawings.

Referring generally to FIGS. 1 through 5, systems and methods for sample inspection (e.g. sample metrology, the detection of physical defects, or the like) using multiple particle beams are described, in accordance with one or more embodiments of the present disclosure. Embodiments of the present disclosure are directed to sample inspection using multiple independently-controllable particle beams. Additional embodiments of the present disclosure are directed to sample inspection using multiple independently-controllable particle beams having different beam characteristics. For example, a system for sample inspection may include multiple independently-controllable beams having different particle energies, different current densities, different spot sizes on a sample under test, or the like. Additional embodiments of the present disclosure are directed to performing different simultaneous tasks with each of the multiple independently-controllable particle beams. For example, one or more particle beams may scan a portion of a sample to generate an image of the portion of the sample (e.g. a scanning electron microscope image, a voltage contrast image, or the like) for the detection of defects. By way of another example, one or more particle beams may emulate a current and/or a voltage source on the sample. In this regard, a voltage and/or a current may be generated on one portion of the sample with a first particle beam and an image of another portion of the sample may be generated by a second particle beam. Further, the image generated by the second particle beam may be dependent on the voltage and/or current generated by the first particle beam. Further embodiments of the present disclosure are directed to determining the relative positions of elements on the sample as part of a sample inspection process. In this regard, multiple independently-controllable particle beams may provide alignment data (e.g. offset data, scaling data, orientation data, or the like) to relate measured structures on a sample to design data.

It is recognized herein that sample inspection may include, but is not limited to, any type of metrology known in the art such as, but not limited to, imaging metrology, scatterometry, or spectral metrology. Further, sample inspection may include the acquisition of metrology data (e.g., data associated with the physical layout of a sample surface, data associated with material properties of one or more layers of material on a sample, or the like) as well as processing and/or analysis of the metrology data. Accordingly, sample inspection may include, but is not limited to, physical defect detection, voltage contrast fault detection, mask misalignment, or the like.

It is further recognized herein that inspection systems utilizing particle beams (e.g. electron beams, ion beams, or the like) may be particularly useful for detecting and/or identifying defect mechanisms on a semiconductor sample (e.g. a random logic chip, or the like) due to a high achievable spatial resolution. For example, particle beams may be utilized within an inspection system to image a sample (e.g. by capturing secondary electrons, backscattered electrons, or the like emanating from the sample). Additionally, structures on a sample (e.g. a patterned semiconductor wafer) may exhibit charging effects in response to excitation with a particle beam. Charging effects may include a modification of the number of electrons (e.g. secondary electrons) captured by the system and thus the signal strength. In this regard, a voltage contrast imaging (VCI) system may generate a high-resolution image of a sample in which the intensity of each pixel of the image provides data on the electrical properties of the sample at the pixel location. For example, insulating structures and/or structures that are not connected to a ground source (e.g. are not grounded) may develop a charge (e.g. a positive charge or a negative charge) in response to depletion of particles (e.g. secondary electrons, ions, or the like) induced by the particle beam. Accordingly, the induced charge may deflect the trajectories of secondary electrons and reduce the signal intensity captured by a detector. Conversely, grounded structures may not develop a charge and therefore may exhibit a strong signal (e.g. appear bright in an associated voltage contrast image). Further, the signal strength of capacitive structures may be a function of the scan speed and/or the energy of the particle beam. In this regard, a voltage contrast image may include a grayscale image in which the grayscale value of each pixel provides data on the relative electrical characteristics of that location on the wafer.

Accordingly, VCI may be utilized to detect defects associated with a sample. For example, defects in a sample die may be characterized by comparing a voltage contrast image of the sample die with a voltage contrast image of a reference die (e.g. die-to-die (D2D) inspection, standard reference die (SRD) inspection, or the like) or by comparing a voltage contrast image of the sample die with an image based on design characteristics (e.g. die-to-database (D2DB) inspection). Inspection systems using persistent data (e.g. stored data) is generally described in U.S. Pat. No. 8,126,255, issued on Feb. 28, 2012, which is incorporated herein by reference in its entirety. Inspection systems using design data of a sample to facilitate inspection is generally described in U.S. Pat. No. 7,676,077, issued on Mar. 9, 2010, and U.S. Pat. No. 6,154,714, issued on Nov. 28, 2000, and U.S. Pat. No. 8,041,103, issued on Oct. 18, 2011, which are incorporated herein by reference in their entirety. The determination of defect and fault sources are generally described in U.S. Pat. No. 6,920,596, issued on Jul. 19, 2005, U.S. Pat. No. 8,194,968, issued on Jun. 5, 2015, and U.S. Pat. No. 6,995,393, issued on Feb. 7, 2006, which are incorporated herein by reference in their entirety. Device property extraction and monitoring is generally described in U.S. Pat. No.

8,611,639, issued on Dec. 17, 2013. Sample device designs suitable for VCI are generally described in U.S. Pat. No. 6,509,197, issued on Jan. 21, 2003, U.S. Pat. No. 6,528,818, issued on Mar. 4, 2003, U.S. Pat. No. 6,576,923, issued on Jun. 10, 2003, and U.S. Pat. No. 6,636,064, issued on Oct. 21, 2003, which are incorporated herein by reference in their entirety. The use of reticles in inspection systems is generally described in U.S. Pat. No. 6,529,621, issued on Mar. 4, 2003, U.S. Pat. No. 6,748,103, issued on Jun. 8, 2004, and U.S. Pat. No. 6,966,047, issued on Nov. 15, 2005, which are incorporated herein by reference in their entirety. Generating an inspection process or inspection target is generally described in U.S. Pat. No. 6,691,052, issued on Feb. 10, 2004, U.S. Pat. No. 6,921,672, issued on Jul. 26, 2005, and U.S. Pat. No. 8,112,241, issued on Feb. 7, 2012, which are incorporated herein by reference in their entirety. Determination of critical areas of semiconductor design data is generally described in U.S. Pat. No. 6,948,141, issued on Sep. 20, 2005, which is incorporated by reference herein in its entirety.

VCI may be performed by providing a voltage and/or a current source at one or more points on a sample to further impact the charging characteristics of the sample and thus the resulting voltage contrast image (e.g. active VCI). Typical active VCI systems may include one or more physical probes to provide a voltage and/or a current to the sample. However, such systems provide limited throughput due to time-intensive alignment procedures required to properly align the physical probes to the sample. Further, the size of probe pads on the sample needed to receive the physical probes must be sufficiently large to allow for alignment of the physical probes within a specified tolerance, which may be undesirable in applications where space on a sample is limited. Some embodiments of the present disclosure are directed to emulating a voltage and/or a current source with one or more independently-controllable particle beams, which may provide high throughput inspection and enable space-optimized targets on the sample.

Additional embodiments of the present disclosure are directed to independently-controllable arrays of beams. For example, one or more independently-controllable particle beams may include an array of particle beams. In this regard, multiple portions of the sample may be interrogated in parallel, which may provide increased throughput relative to a system without arrays of beams. The use of dual-energy electron flooding for neutralization of a charged substrate is generally described in U.S. Pat. No. 6,930,309, issued on Aug. 16, 2005, which is incorporated herein by reference in its entirety. The use of particle beams with different energies are generally described in U.S. Pat. No. 6,803,571, issued on Oct. 12, 2004, and U.S. Pat. No. 7,217,924, issued on May 15, 2007, which are incorporated herein by reference in their entirety. The use of multiple particle beams for sample inspection are generally described in U.S. Pat. No. 6,774,646, issued on Aug. 10, 2004, U.S. Pat. No. 7,391,033, issued on Jun. 24, 2008, and U.S. Pat. No. 8,362,425, issued on Jan. 29, 2013, which are incorporated herein by reference in their entirety. A multiple-column particle beam systems and methods are generally described in U.S. Pat. No. 8,455,838, issued on Jun. 4, 2013, which is incorporated herein by reference in its entirety.

FIG. 1A is a simplified schematic view of an inspection system with multiple independently-controllable particle beams, in accordance with one or more embodiments of the present disclosure. In one embodiment, the system 100 includes a particle source 102 configured to generate two or more particle beams 104. The particle source 102 may include any particle source known in the art suitable for generating a particle beam 104. For example, the particle source 102 may include an electron source such that one or more particle beams 104 include electron beams. By way of another example, the particle source 102 may include an ion source such that the one or more particle beams 104 may include ion beams. By way of an additional example, the particle source 102 may generate particle beams 104 of different types (e.g. one or more electron beams and one or more ion beams). Additionally, although not shown, system 100 may include one or more additional illumination sources (e.g. optical sources, or the like) suitable for illuminating a sample for the purposes of sample inspection and/or sample alignment. Further, the particle source 102 may include, but is not limited to, one or more electron guns, one or more ion guns, one or more cathode sources, one or more emitter tips, one or more anodes, or one or more gate valves.

In another embodiment, the particle source 102 is configured to provide particle beams 104 with independently-tunable energy. For example, a particle source 102 including an electron source may, but is not limited to, provide an accelerating voltage in the range of 0.1 kV to 30 kV. As another example, a particle source including an ion source may, but is not required to, provide an ion beam with an energy in the range of 1 to 50 keV.

In another embodiment, the system 100 includes an inspection sub-system 106 to direct the particle beam 104 to a sample 108. In one embodiment, the inspection sub-system 106 includes one or more particle focusing elements 110. For example, the one or more particle focusing elements 110 may include, but are not limited to, a single particle focusing element or one or more particle focusing elements forming a compound system. In another embodiment, the one or more particle focusing elements 110 include an objective lens configured to direct the particle beam 104 to the sample 108. Further, the one or more particle focusing elements 110 may include any type of lenses known in the art including, but not limited to, electrostatic, magnetic, uni-potential, or double-potential lenses. Additionally, the system 100 may include one or more elements held at a controlled electrical potential with respect to the sample to modify the landing energies of the particle beams 104.

In another embodiment, the inspection sub-system 106 includes one or more particle control elements for controlling one or more characteristics of the particle beam on the sample 108. For example, the particle control elements may include one or more particle scanning elements 112 and/or one or more particle focusing elements 114.

In one embodiment, the inspection sub-system 106 includes particle scanning elements 112 for each particle beam 104. In this regard, the position of each particle beam 104 may be independently-controlled on the sample 108. The particle scanning elements 112 may include, but are not limited to, one or more scanning coils or deflectors suitable for controlling a position of the particle beams 104 relative to the surface of the sample 108. In this regard, particle scanning elements 112 may scan the particle beams 104 across the sample 108 in a selected pattern. It is noted herein that the inspection sub-system 106 may operate in any scanning mode known in the art. For example, the inspection sub-system 106 may operate in a step-and-scan mode when scanning a particle beam 104 across the surface of the sample 108. In this regard, the inspection sub-system 106 may scan a particle beam 104 across the sample 108, which may be nominally stationary with respect to the particle beam 104 or in synchronous motion with the particle beam 104.

In another embodiment, the system 100 includes one or more particle focusing elements 114 for individually controlling the focal characteristics (e.g. spot size, depth of focus, or the like) of the particle beams 104 on the sample 108. For example, the system may include a particle focusing element 114 for each particle beam 104 provided by the particle beam source 102. It is to be understood that all focusing elements included in the system 100 may operate as a compound system such that the focusing characteristics on the sample 108 may be influenced by the focal characteristics and spacing between the focusing elements. For example, as illustrated in FIG. 1A, the spot sizes of particle beams 104 on the sample 108 may be influenced by particle focusing elements 114 and particle focusing elements 110 (e.g. an objective lens). Accordingly, the system 100 may independently control the spot sizes of the particle beams 104 on the sample by varying the focal characteristics of the particle focusing elements 114. Further, the one or more particle focusing elements 114 may include any type of particle lenses known in the art including, but not limited to, electrostatic, magnetic, uni-potential, or double-potential lenses.

In another embodiment, the sample 108 is disposed on a sample stage 116 suitable for securing the sample 108. In another embodiment, the sample stage 116 is an actuatable stage suitable for positioning the sample. For example, the sample stage 116 may include, but is not limited to, one or more translational stages suitable for selectably translating the sample 108 along one or more linear directions (e.g., x-direction, y-direction and/or z-direction). By way of another example, the sample stage 116 may include, but is not limited to, one or more rotational stages suitable for selectably rotating the sample 108 along a rotational direction. By way of another example, the sample stage 116 may include, but is not limited to, a rotational stage and a translational stage suitable for selectably translating the sample along a linear direction and/or rotating the sample 108 along a rotational direction.

Accordingly, the inspection sub-system 106 may operate in a swathing mode when scanning one or more particle beams 104 across the surface of the sample 108. In this regard, the inspection sub-system 106 may scan the one or more particle beams 104 across the sample 108 while the sample is moving, with the direction of scanning being nominally perpendicular to the direction of the stage translation direction.

In another embodiment, the inspection sub-system includes one or more detectors 118 to image or otherwise detect particles emanating from the sample 108 (e.g. charged particles, neutral particles, photons, or the like). In one embodiment, the detector 118 includes an electron collector (e.g., a secondary electron collector, a backscattered electron detector, or the like). In another embodiment, the detector 118 includes a photon detector (e.g., a photodetector, an x-ray detector, a scintillating element coupled to photomultiplier tube (PMT) detector, or the like) for detecting electrons and/or photons from the sample surface.

The one or more detectors 118 may be configured to independently measure particles emanating from the sample 108 in response to the multiple particle beams 104. In one embodiment, the system 100 may include separate detectors 118 associated with each particle beam 104. In another embodiment, a detector 118 may distinguish signals from different particle beams. For example, signals from different particle beams 104 may be imaged to different portions of the detector 118. By way of another example, a detector 118 may include dispersive elements to direct particles from the sample 108 to different portions of a detector 118 based on the particle energy.

In another embodiment, the detector 118 may be synchronized with one or more particle beams 104. For example, one or more particle beams 104 may be pulsed at a rate synchronous with a detection rate of the detector 118. Accordingly, a first particle beam 104 may induce charge build-up on the sample that is detectable by a second particle beam 104 synchronized to the detector 118. Further, the first and second particle beams 104 may be scanned across the sample to generate an interlaced image (e.g. a scanning electron microscope image, a voltage contrast image, or the like).

In another embodiment, the system 100 includes a controller 120 including one or more processors 122 and a memory medium 124. The controller 120 may be communicatively coupled to any elements in the system 100 to send and/or receive control signals. For example, the controller may be communicatively coupled to the detector 118 to receive one or more data signals from the detector assembly for the generation of an image (e.g. a voltage contrast image) of the sample 108. By way of another example, the controller 120 may provide synchronization signals to the detector 118 to control the timing of data collection. In another embodiment, the controller 120 is communicatively coupled to the sample stage 116. In this regard, the controller 120 may direct and/or receive the position of the sample stage such that the one or more signals received from the detector 118 may be correlated with the position of the sample. In another embodiment, the controller 120 is communicatively coupled with the particle source 102. For example, the controller 120 may be communicatively coupled to the particle source 102 to control the energy of the particle beam 104. As another example, the controller 120 may be communicatively coupled to the particle source 102 and/or the inspection sub-assembly 106 (e.g. one or more particle scanning elements 112 of the inspection sub-assembly 106) to direct/and or receive the position of the particle beam 104 with respect to the sample 108. In this regard, the controller 120 may generate an image (e.g. a voltage contrast image) utilizing the one or more signals from the detector 118 as the particle beam 104 is scanned across the sample 108.

In another embodiment, the controller 120 is configured to identify one or more defects on the sample 108 based on the one or more signals received from the detector 118. Identifiable defects may include, but are not limited to, physical defects (e.g. a bridge defect improperly connecting two structures, a gap defect indicating a weak or nonexistent connection between structures, peeling or improper contact between materials within the structures, or the like), electrical defects (e.g. variations in a resistance, capacitance, bandgap, or the like), or a combination thereof. For example, physical defects may induce a modification of the electrical properties of one or more structures from an expected value (e.g. a bridge defect between conducting structures may modify the function of the associated electrical circuit, a gap defect may electrically isolate one or more structures, or the like). Further, defects may be located on the surface or within one or more layers of a multilayer structure (e.g. a patterned semiconductor device including patterned layers of insulating, conducting, and/or semiconducting materials).

Figure 1B:
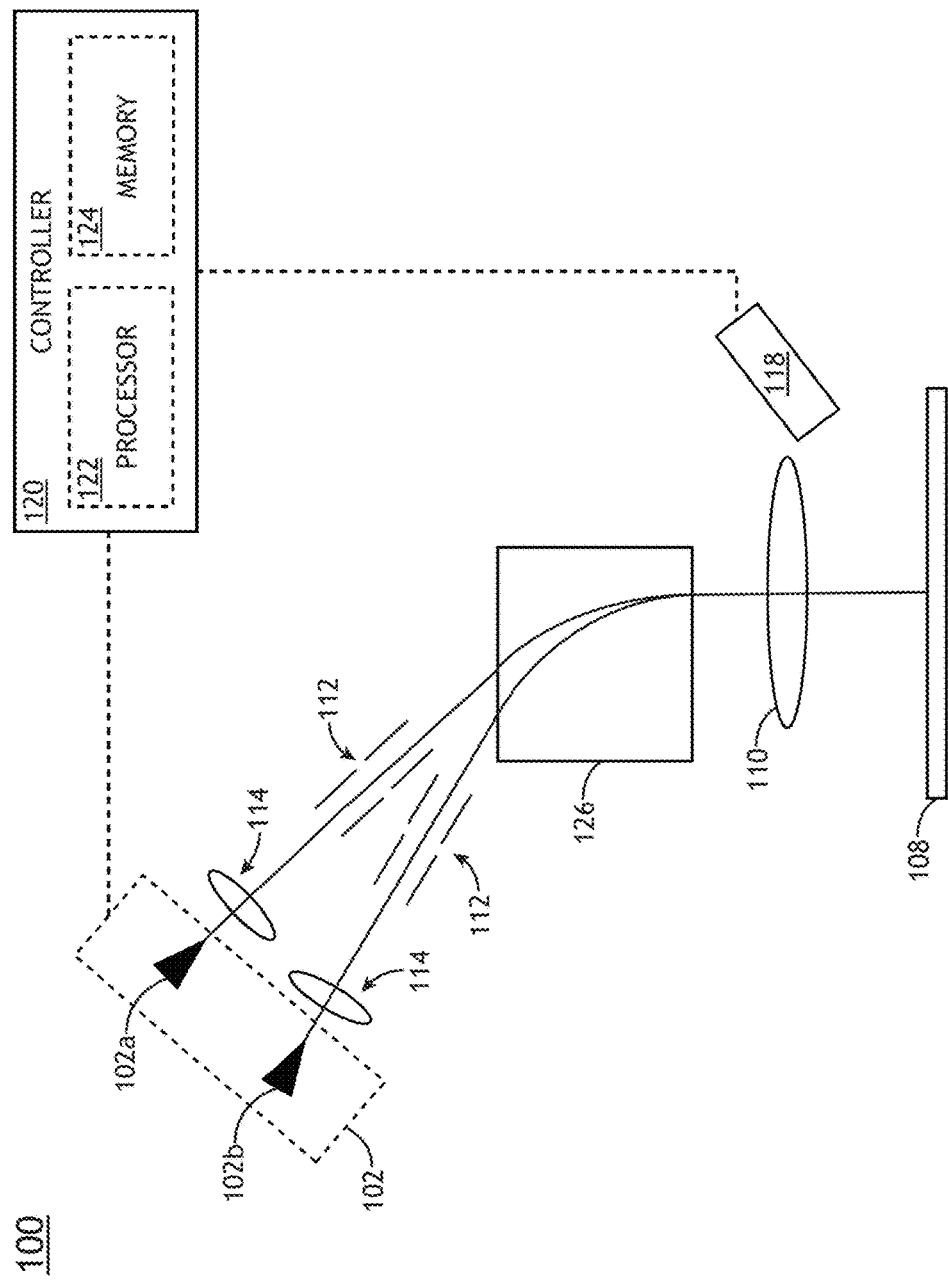
FIG. 1B is a simplified schematic view of an inspection system with two independently-controllable particle beams generated by separate particle guns, in accordance with one or more embodiments of the present disclosure.
Figure 1C:
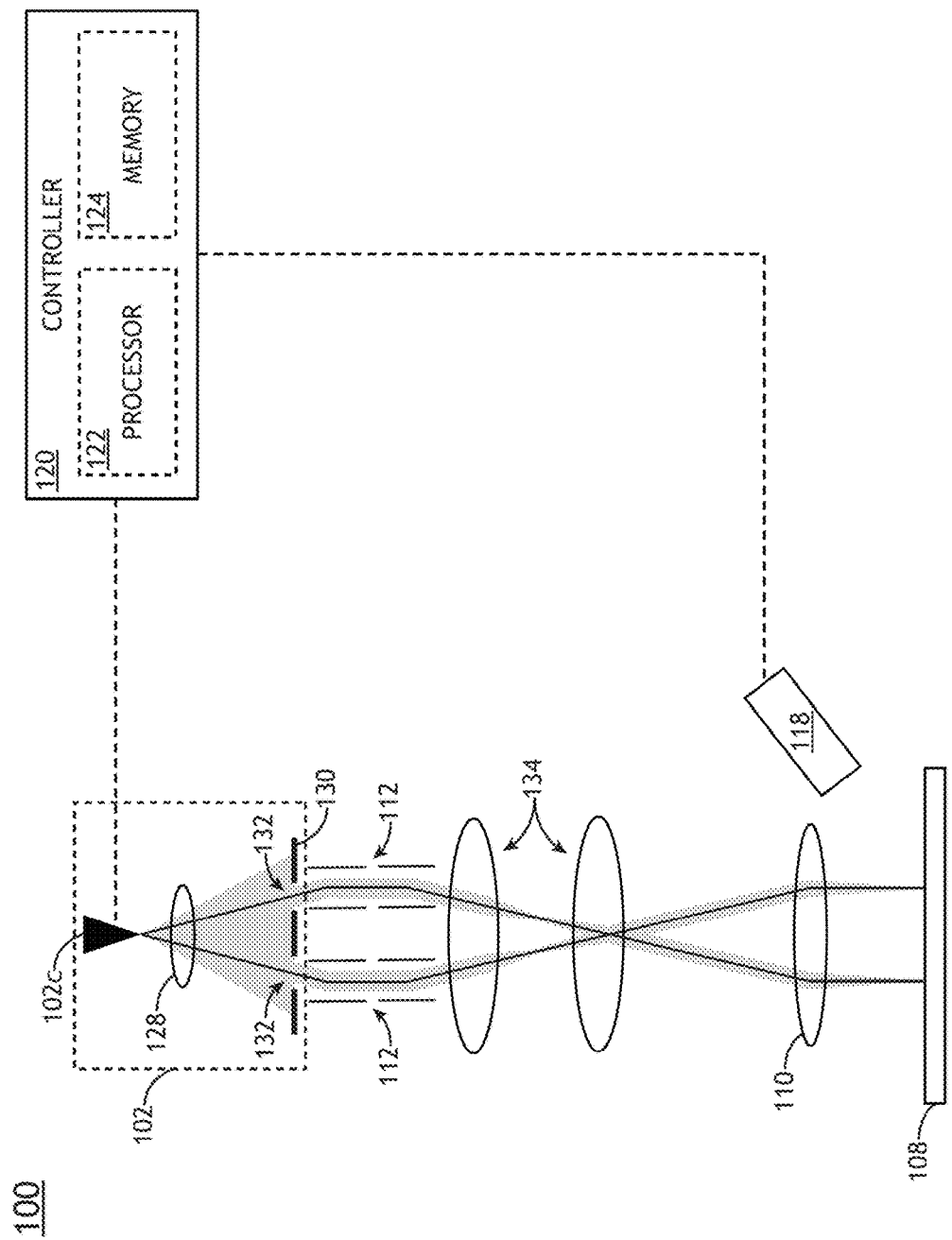
FIG. 1C is a simplified schematic view of an inspection system with two independently-controllable particle beams generated by a single particle gun, in accordance with one or more embodiments of the present disclosure.

Referring generally to FIGS. 1B and 1C, additional embodiments of system 100 are described.

FIG. 1B is a simplified schematic view of an inspection system with two independently-controllable particle beams generated by separate particle guns, in accordance with one or more embodiments of the present disclosure. In one embodiment, the particle source 102 includes a first particle gun 102*a* and a second particle gun 102*b* for the generation of two particle beams 104. In this regard, the first and second particle guns 102*a,b* may generate particle beams 104 with independently-controllable beam characteristics (e.g. particle energies, energy densities, spot sizes, and the like). For example, particle guns 102*a,b* may be biased at different electrical potentials with respect to the sample 108 to generate particle beams 104 with different particle energies.

In another embodiment, the system 100 includes a beam combiner 126 to accept particle beams 104 from different trajectories (e.g. from particle guns 102*a,b*) and direct the particle beams 104 to the sample 108 (e.g. via the particle focusing elements 110, or the like). As illustrated in FIG. 1B, the trajectories of particle beams 104 from different particle guns may be combined such that particle beams 104 from different particle guns may be incident on the sample 108 at the same location. Additionally, the particle scanning elements 112 may individually manipulate the trajectories of the particle beams 104 such that the locations of the particle beams 104 on the sample 108 are individually controllable. The beam combiner 126 may include any type of beam combiner known in the art suitable for receiving multiple particle beams 104. For example, the beam combiner 126 may include a dispersive element to modify the trajectories of particle beams based on particle energy. In one embodiment, the beam combiner includes a magnetic prism array. In this regard, the magnetic prism array may include a square magnetic field surrounded by additional sectors with adjustable magnetic fields (e.g. by independent coils, or the like). Accordingly, the magnetic prism array may be configured to deflect incident particle beams 104 by approximately 90 degrees. Further, the magnetic prism array may operate as a series of lenses suitable for the generation of images (e.g. of the sample, back focal plane of the objective lens, or the like).

In another embodiment, though not shown, particles emanating from the sample 108 may be collected by the particle focusing element 110 and directed through the beam combiner 126 (e.g. a magnetic prism array, or the like). Further, the particles from the sample 108 may be deflected in the beam combiner 126 and detected by one or more detectors 118.

FIG. 1C is a simplified schematic view of an inspection system with two independently-controllable particle beams generated by a single particle gun, in accordance with one or more embodiments of the present disclosure. In one embodiment, the particle source 102 includes a single particle gun 102*c*. In another embodiment, the particle source 102 includes a particle focusing element 128 to spread the particles emanating from the particle source 102 and direct them to an aperture 130 including two or more openings 132. In this regard, particles from the particle gun 102*c* may propagate through the openings 132 of the aperture 130 to define two or more particle beams 104. In another embodiment, the system 100 includes one or more additional particle focusing elements 134 to collimate or focus the particle beams 104. Further, particle scanning elements 112 may modify the trajectories of any of the particle beams 104 so that the positions of the particle beams 104 on the sample 108 may be independently controlled.

It is to be understood that the system 100 may include any other suitable elements known in the art. In addition, the system 100 may be further configured as described in U.S. Pat. No. 8,664,594 issued Apr. 4, 2014, U.S. Pat. No. 8,692,204 issued Apr. 8, 2014, U.S. Pat. No. 8,698,093 issued Apr. 15, 2014, and U.S. Pat. No. 8,716,662 issued May 6, 2014, which are incorporated herein by reference in their entirety.

Figure 2:
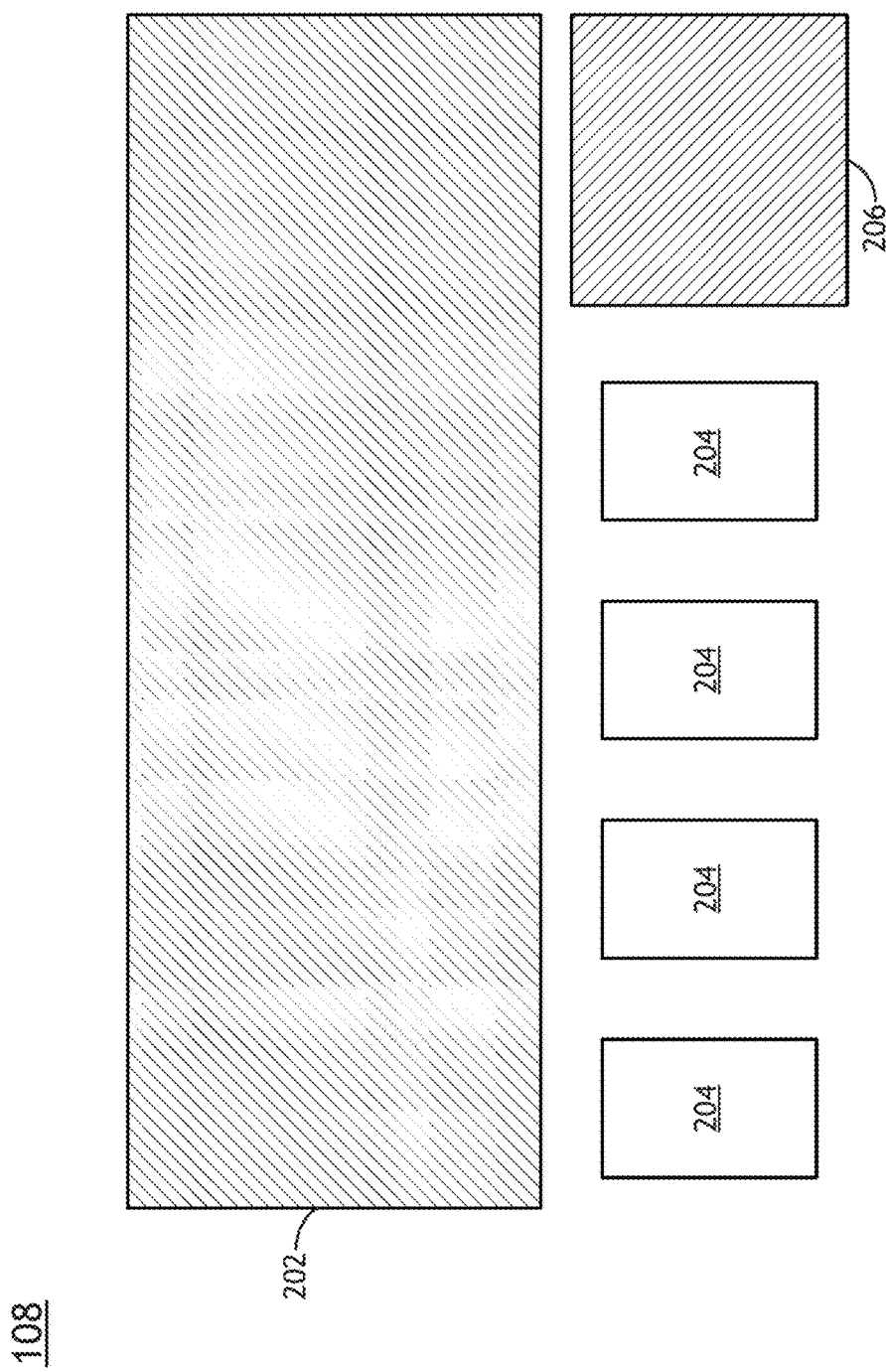
FIG. 2 is a conceptual view of structures on a sample suitable for an inspection system including multiple independently controllable beams, in accordance with one or more embodiments of the present disclosure.

Referring generally to FIG. 2, a system 100 may perform sample inspection by simultaneously directing independently-controllable particle beams 104 to different portions of the sample 108 to simultaneously accomplish multiple aspects of sample inspection. FIG. 2 is a conceptual view of structures on a sample 108 suitable for an inspection system including multiple independently controllable beams, in accordance with one or more embodiments of the present disclosure.

In one embodiment, particle beams 104 may be directed to one or more care areas 202 of a sample 108 containing structures to be inspected (e.g. structures associated with a semiconductor device after one or more fabrication steps, one or more test structures configured to provide representative data associated with structure geometries of interest, or the like). In another embodiment, particle beams 104 may be directed to one or more interface pads 204 (e.g. electrical pads, or the like). For example, interface pads 204 may be connected (e.g. electrically connected, mechanically connected, or the like) to structures within the one or more care areas 202. In one instance, interface pads 204 may provide measurement sites associated with one or more structures in a care area 202. In another instance, interface pads 204 may be utilized in active voltage contrast measurements. In this regard, a voltage and/or current associated with an interface pad 204 may induce charge to build up on one or more structures inside a care area 202 that may impact voltage contrast data of structures in the care area 202. In another embodiment, particle beams 104 may be directed to an alignment target 206. In this regard, alignment data (e.g. offsets, scaling factors, and the like) may be generated to relate the location and size of fabricated structures in the care areas 202 to design data.

It is to be understood that FIG. 2 and the associated description above are provided solely for illustrative purposes and should not be interpreted as limiting the present disclosure. For example, a sample 108 may include any number of care areas 202, interface pads 204, or alignment targets 206.

In another embodiment, particle scanning elements 112 scan at least one particle beam 104 across a portion of a care area 202 and capture emitted particles by the detector 118 to generate an image of the portion of the care area 202. In this regard, the system 100 may inspect the sample (e.g. to detect defects, or the like).

It is noted herein that the system 100 (e.g., via controller 120) may identify one or more defects associated with structures in a care area 202 using any method known in the art including, but not limited to, a die-to-die (D2D) inspection technique, a standard reference die (SRD) inspection technique, a die-to-database (D2DB) inspection technique, a template-based inspection (TBI) technique, or a context-based inspection (CBI) technique. For example, the controller 120 may detect one or more defects on the sample 108 by comparing images of the sample (e.g., collected by the detector 118) to persistent reference data (e.g., one or more reference images). For example, a reference image may be stored in a data storage system (e.g., a database, a server, or the like) and utilized for defect detection. In another embodiment, the controller 120 generates and/or receives a simulated image based on design data associated with the sample 108 to operate as a reference image for defect detection.

Accordingly, the controller 120 may perform D2DB inspection by comparing measured sample data to the reference image.

Further, the system 100 may be configured as a "real" or a "virtual" inspection system. For example, the system 100 may generate actual images or other output data associated with the sample 108. In this regard, the system 100 may be configured as an "real" inspection system, rather than a "virtual" system. By way of another example, a storage medium (not shown) and the controller 120 described herein may be configured as a "virtual" inspection system. Accordingly, the system 100 may not operate on a physical sample, but may rather reproduce and/or stream stored data (e.g., data stored in a memory medium 124, or the like) as if a physical sample were being scanned. In this regard, the output of a "detector" may be data that was previously generated by one or more detectors (e.g., a detector 118) of an actual inspection system in a previous step (e.g., all grayscale values associated with a voltage contrast image, or the like). Systems and methods configured as "virtual" inspection systems are described in commonly assigned U.S. Pat. No. 8,126,255 issued on Feb. 28, 2012, and U.S. Pat. No. 9,222,895, issued on Dec. 29, 2015, both of which are incorporated by reference in their entirety.

In another embodiment, the controller 120 identifies one or more defects on the sample 108 by generating voltage contrast data (e.g. one or more voltage contrast images) of the sample 108. Further, the controller 120 may compare the VCI data to corresponding reference data to detect defects.

In another embodiment, the controller 120 utilizes design data to facilitate inspection. For example, design data may include characteristics of individual components and/or layers on the sample 108 (e.g. an insulator, a conductor, a semiconductor, a well, a substrate, or the like), a connectivity relationship between layers on the sample 108, or a physical layout of components and connections (e.g. wires) on the sample 108. As another example, design data may include a description of the connectivity of components within an electrical circuit (e.g. netlist data, circuit simulation data, hardware description language data, or the like). In this regard, the intended functionality of a sample 108 (e.g. the intended functionality of a logic circuit patterned on a semiconductor wafer, or the like) may provide context for the interpretation of VCI data.

It is noted herein that the terms "design" and "design data" as used herein generally refer to the physical design (layout) of an IC and data derived from the physical design through complex simulation or simple geometric and Boolean operations. The physical design may be stored in a data structure such as a graphical data stream (GDS) file, any other standard machine-readable file, any other suitable file known in the art, and a design database. A GDSII file is one of a class of files used for the representation of design layout data. Other examples of such files include GL1 and OASIS files and proprietary file formats such as RDF data, which is proprietary to KLA-Tencor, Milpitas, Calif. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in U.S. Pat. No. 7,570,796 issued on Aug. 4, 2009 and U.S. Pat. No. 7,676,077 issued on Mar. 9, 2010, both of which are incorporated by reference in their entirety. In addition, the design data can be standard cell library data, integrated layout data, design data for one or more layers, derivatives of the design data, and full or partial chip design data.

In some instances, simulated or acquired images from a wafer or reticle may be used as a proxy for the design. Image analysis may also be used as a proxy for design analysis. For example, polygons in the design may be extracted from an image of a design printed on a wafer and/or reticle, assuming that the image of the wafer and/or reticle is acquired with sufficient resolution to adequately image the polygons of the design. In addition, the "design" and "design data" described herein may refer to information and data generated by semiconductor device designers in a design process and is therefore available for use in the embodiments described herein well in advance of printing of the design on any physical wafers.

Preferably, the "design" or "physical design" as those terms are used herein refer to the design as it would be ideally formed on the wafer. In this manner, a design or physical design described herein would preferably not include features of the design that would not be printed on the wafer such as optical proximity correction (OPC) features, which are added to the design to enhance printing of the features on the wafer without actually being printed themselves. In this manner, in some embodiments, the design for the wafer used for steps described further herein does not include features of the design that will not be printed on the wafer.

In one embodiment, design data utilized to facilitate inspection (e.g., by the controller 120) includes one or more netlists. Netlists may include any type of netlist known in the art for providing a description of the connectivity of an electrical circuit including, but not limited to, physical netlists, logical netlists, instance-based netlists, or net-based netlists. Further, a netlist may include one or more sub-netlists (e.g., in a hierarchal configuration) to describe circuits and/or sub-circuits on a sample 108. For example, netlist data associated with a netlist may include, but is not limited to, a list of nodes (e.g., nets, wires between components of a circuit, or the like), a list of ports (e.g., terminals, pins, connectors, or the like), a description of electrical components between the nets, (e.g., resistor, capacitor, inductor, transistor, diode, power source, or the like), values associated with the electrical components (e.g., a resistance value in ohms of a resistor, a voltage value in volts of a power source, frequency characteristics of a voltage source, initial conditions of components, or the like). In another embodiment, design data may include one or more netlists associated with specific steps of a semiconductor process flow. For example, a sample 108 may be inspected (e.g., by system 100) at one or more intermediate points in a semiconductor process flow. Accordingly, design data utilized to facilitate inspection may be specific to the layout of the sample 108 at a current point in the semiconductor process flow. In this regard, a netlist associated with a particular intermediate point in a semiconductor process flow may be derived (e.g., extracted, or the like) from either the physical design layout in combination with a technology file (layer connectivity, electrical properties of each of the layers, and the like) or a netlist associated with a final layout of a sample 108 to include only components present on the sample at the particular intermediate point in the semiconductor process flow.

In another embodiment, the particle scanning elements 112 direct at least one particle beam 104 to an interface pad 204 to induce a voltage and/or a current in one or more structures of the care area 202 connected to the interface pad 204. For example, the particle scanning elements 112 may direct a particle beam with a high energy density to an interface pad 204 that is electrically connected to one or more structures within a care area 202. In this regard, the interface pad 204 may absorb and/or emit charged particles in response to the particle beam 104. Accordingly, a charge imbalance may be established at the location of the incident particle beam 104 with respect to additional structures in the care area 202. In this regard, the interface pad 204 may act as a voltage and/or current source that may influence the charge characteristics of structures within the care area 202. In one instance, a particle beam 104 is incident on a floating interface pad 204 connected to floating structures in a care area 202 may cause a charge to build up on all connected structures in the care area 202, which may be visible on a VCI (e.g., appear dimly in a VCI). In another instance, a particle beam 104 incident on a floating interface pad 204 connected to a structure in a care area 202 with a defect (e.g., a short to ground) may appear relatively bright on a VCI.

In one embodiment, the system 100 may probe one or more interface pads 204 (e.g. by determining a voltage contrast value of a particle beam 104 incident on the interface pads 204). For example, two interface pads 204 may be connected by a structure in a care area 202 (e.g. a long structure in a serpentine pattern, or the like). In this regard, particle scanning elements 112 may direct a first particle beam 104 (e.g. a relatively high energy density particle beam 104) to a first interface structure to induce a voltage and/or current. Accordingly, particle scanning elements 112 may direct a second particle beam 104 (e.g. a relatively low energy density particle beam 104) to probe a second interface pad 204 and generate a voltage contrast value. In this regard, defects in the structure connecting the first and second interface pads 204 may be detected based on a voltage contrast value of the second interface pad 204. In the case that no defect is present, the second interface pad 204 will charge and appear dim (e.g. have a low voltage contrast value). In the case that a defect is present (e.g. an electrical short), the second interface pad 204 will appear relatively bright (e.g. have a higher voltage contrast value).

In another embodiment, the system 100 may pump one or more structures (e.g. a structure in a care area 202, an interface pad 204, or the like) with a first particle beam 104 having a first energy and probe the same one or more structures with a second particle beam 104 having a second energy. For example, particle focusing elements 114 associated with the first particle beam 104 may generate a relatively large spot size on the sample 108 to pump (e.g. charge) the one or more structures. Further, particle focusing elements 114 associated with the second particle beam 104 may generate a relatively small spot size on the sample 108 such that the second particle beam may probe the structures with a high resolution. Accordingly, the system 100 may generate a high-resolution map of localized electrical properties of the structures.

Figure 3A:
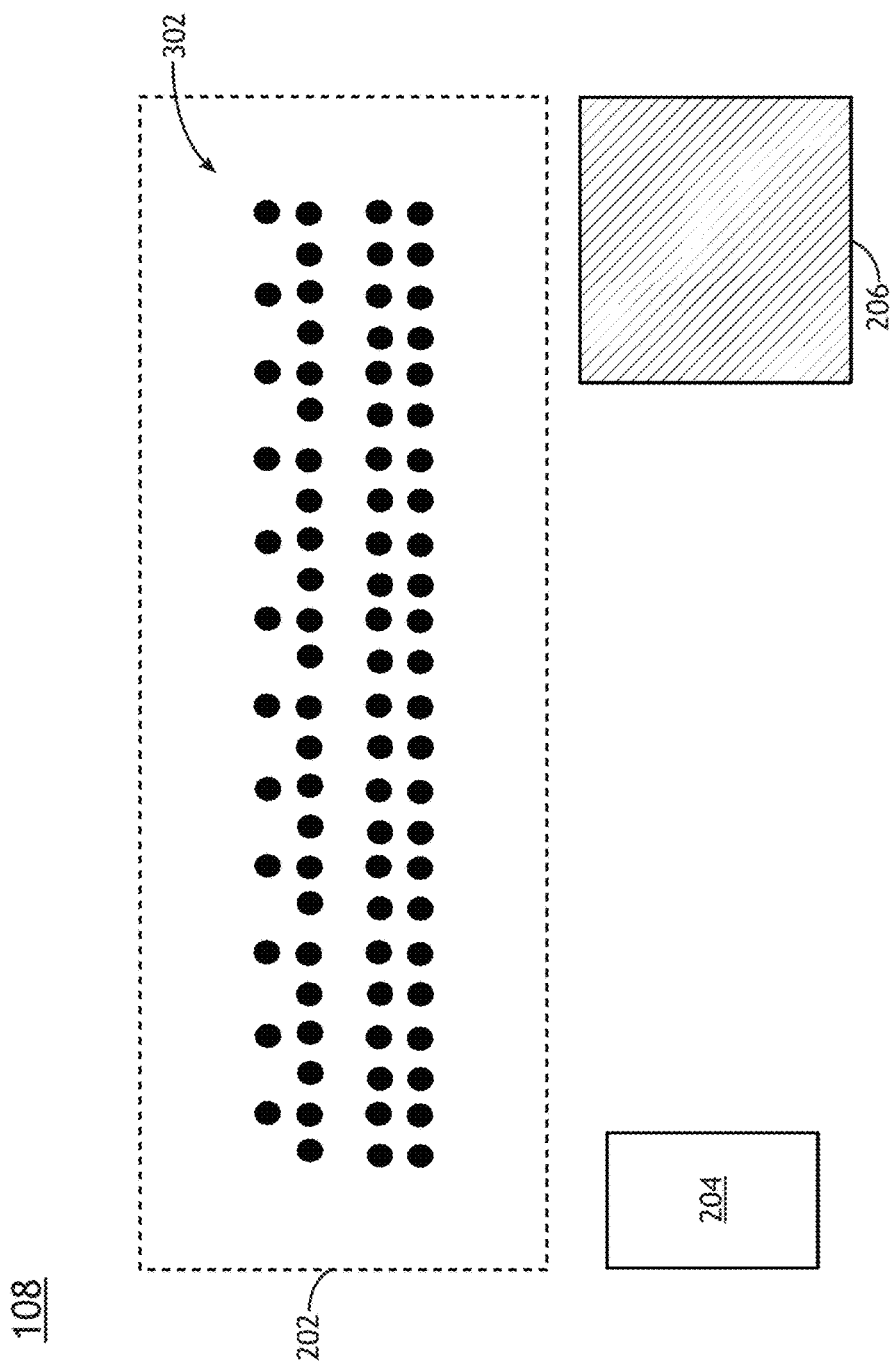
FIG. 3A is a conceptual view of structures on a sample suitable for non-voltage-contrast imaging by an inspection system including multiple independently controllable beams, in accordance with one or more embodiments of the present disclosure.
Figure 3B:
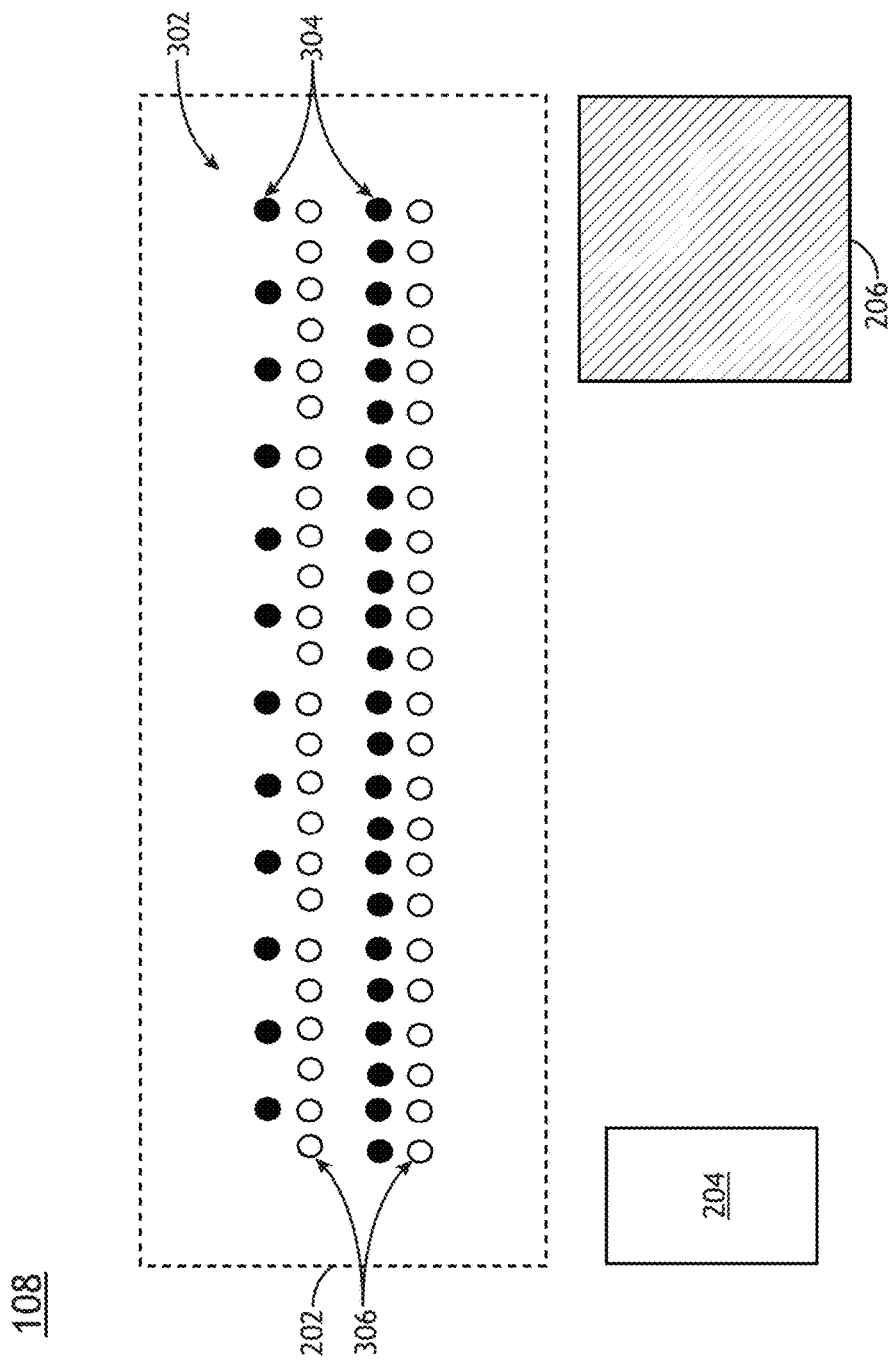
FIG. 3B is a conceptual view of structures on a sample suitable for voltage-contrast imaging by an inspection system including multiple independently controllable beams, in accordance with one or more embodiments of the present disclosure.
Figure 3C:
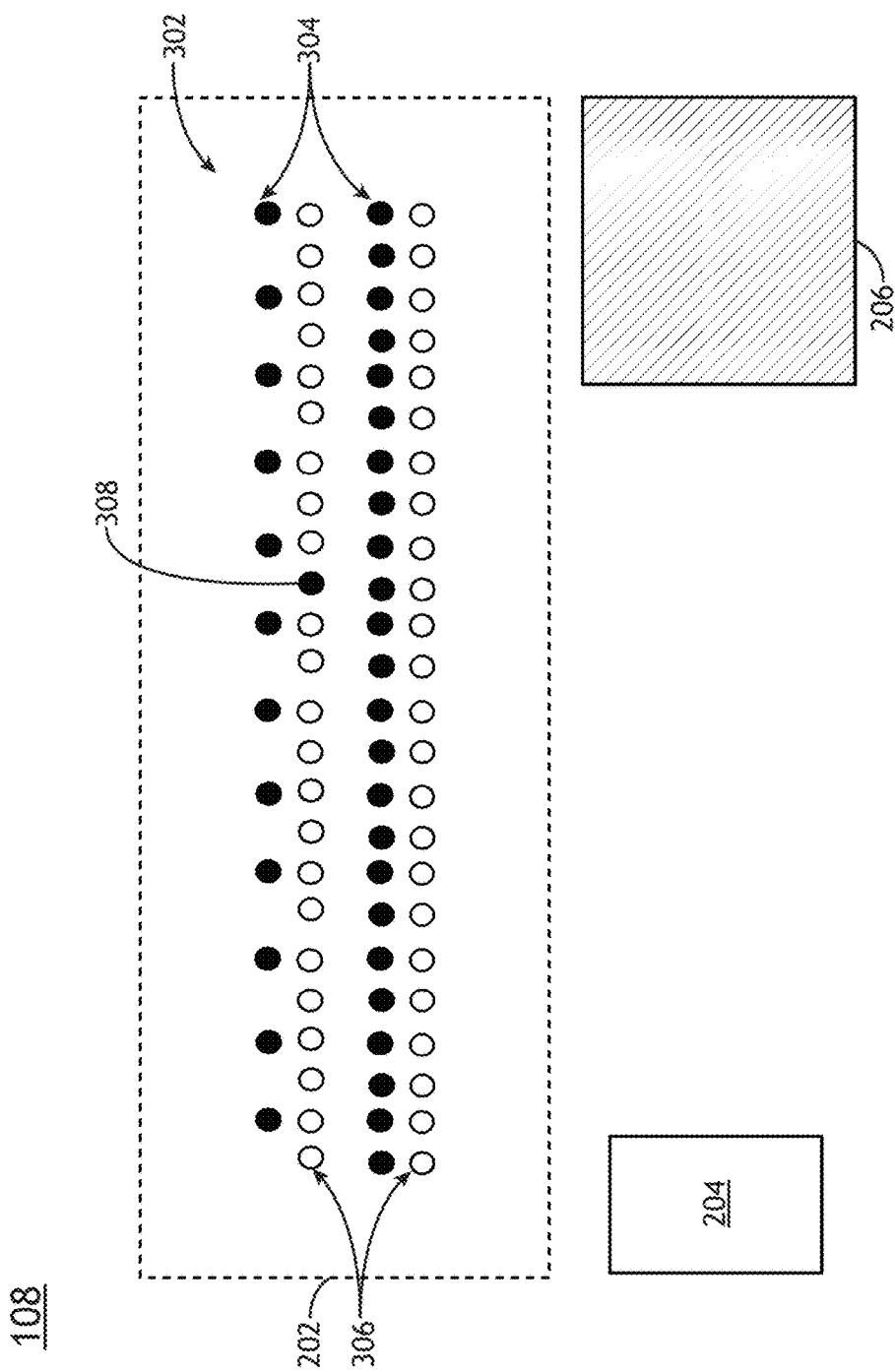
FIG. 3C is a conceptual view of a defect on structures on a sample suitable for voltage-contrast imaging by an inspection system including multiple independently controllable beams, in accordance with one or more embodiments of the present disclosure.

Referring generally to FIGS. 3A through 3C, multiple independently-controllable particle beams 104 may be directed to different portions of a sample 108 to perform a variety of tasks.

FIG. 3A is a conceptual view of structures on a sample 108 suitable for non-voltage-contrast imaging by an inspection system including multiple independently controllable beams, in accordance with one or more embodiments of the present disclosure. In one embodiment, particle scanning elements 112 scan at least one particle beam 104 across a portion 302 of a care area 202 and capture emitted particles by the detector 118 to generate an image of the portion 302 of the care area 202 (e.g., a scanning electron microscope image, or the like). In this regard, the controller 120 may generate a high resolution image of structures in the care area 202. Further, defects may be detected based on a comparison of a measured image to a reference image.

In another embodiment, particle scanning elements 112 may direct an additional particle beam 104 to an alignment target 206. The alignment target 206 may be any type of alignment target known in the art. For example, the alignment target 206 may include one or more structures suitable for providing one or more alignment metrics for the determination of relative locations and/or orientations of structures on the sample 108. For example, alignment metrics may include a location and/or orientation of the alignment target 206 on the sample 108. By way of another example, alignment metrics may include a location and/or orientation of structures in a care area 202 (e.g., relative to the alignment target 206). In one instance, the alignment target 206 may include one or more asymmetric structures (e.g. an open rectangle with one or more gaps, or the like). In this regard, the location and/or orientation of structures within the care area 202 may be determined with respect to the alignment target 206. Further, the system 100 may generate an image of the care area 202 and the alignment target simultaneously using two particle beams 104. It is noted that the relative locations of multiple independently-controllable beams may be well characterized and calibrated to provide accurate measurements. Further, simultaneously imaging the care area 202 and the alignment target 206 may increase throughput relative to a single-beam inspection system.

It is noted herein that determining the relative locations and/or orientations of structures within the care area 202 may be particularly beneficial for align-to-design data acquisition and/or data post-processing. For example, deviations in a semiconductor fabrication process may result in systematic deviations (e.g., a linear stretch, a magnification error, or the like) and/or random deviations (e.g., noise, jitter, and the like) that may result in transformations and/or distortions of measured data with respect to design data. Accordingly, an image of the alignment target may be utilized to map the sample-space coordinates (e.g., physical coordinates) to design space coordinates. Further, the controller 120 may characterize any distortions between a measured image of an alignment target 206 and design characteristics of the alignment target 206). In this regard, the controller 120 may manipulate the measured data (or alternatively, the design data) to account for the characterized distortions.

In another embodiment, measured characteristics of an alignment target 206 may be utilized in a feedback and/or feed-forward scheme to provide control corrections for measurement of structures in care areas 202 in subsequent inspection runs. Further, a single measurement of an alignment target 206 may be used to calibrate many particle beams 204 simultaneously imaging different portions of the sample 108 (e.g. in a multi-beam configuration, a multi-column configuration, a multi-energy configuration, or the like). In this regard, an inspection system 100 including multiple independently-controllable particle beams 104 may provide significant throughput enhancements relative to a single-beam system or a system with an array of fixed beams.

FIG. 3B is a conceptual view of structures on a sample 108 suitable for voltage-contrast imaging by an inspection system including multiple independently controllable beams, in accordance with one or more embodiments of the present disclosure. In one embodiment, particle scanning elements 112 direct a first particle beam to an interface pad 204 connected to structures 306 in a care area 202. Further, particle scanning elements 112 direct a second particle beam 104 to scan the care area 202 to generate a voltage contrast image. For example, structures 304 connected to the irradiated interface pad 204 may become charged and appear relatively dim on a voltage contrast image (as represented by open circles in FIG. 3B). In contrast, structures 304 are not charged and appear relatively bright on a voltage contrast image.

FIG. 3C is a conceptual view of a defect on structures on a sample 108 suitable for voltage-contrast imaging by an inspection system including multiple independently controllable beams, in accordance with one or more embodiments of the present disclosure. In one embodiment, as also illustrated in FIG. 3B, particle scanning elements 112 direct a first particle beam to an interface pad 204 connected to structures 306 in a care area 202. Further, particle scanning elements 112 may direct a second particle beam 104 to scan the care area 202 to generate a voltage contrast image. In this regard, structures 306 electrically connected to interface pad 204 appear dim (e.g., open circles in FIG. 3C) due to stored charge and grounded structures 304 appear bright. In another embodiment, a defect (e.g., an electrical short to ground) of structure 308 connected to interface pad 204 may appear bright due to an available path of stored charge to ground. In this regard, the defect of structure 308 may be identified based on a reference structure (e.g., a physical reference structure, a reference voltage contrast image, or the like).

It is noted herein that structures of a voltage contrast image may typically exhibit a range of grayscale values based on various factors including electrical connectivity to ground or residual capacitance associated with the scanning of a particle beam). Accordingly, the depiction of features as either bright or dim in FIGS. 3B and 3C is for illustrative purposes only and should not be interpreted as limiting the present disclosure.

FIG. 4 is a conceptual diagram illustrating a set of structures in a care area 202 suitable for inspection with an inspection system including multiple independently controllable beams, in accordance with one or more embodiments of the present disclosure. In one embodiment, a care area 202 includes multiple instances of a target pattern 402. For example, each target pattern 402 may include a series of electrically isolated structures 406 separated by a gap 404. Accordingly, a defect (e.g. a bridge defect, or the like) causing an electrical short between structures will modify the voltage contrast values of the defective structures relative to reference data. In one instance, the controller 120 may utilize design data (e.g. netlist data, physical layout data, and the like) to facilitate the inspection of target patterns. In this regard, a bridge defect inducing an electrical short for a selected component of the sample 108 may result in a higher than expected (e.g. relative to reference data) VCI signal for the selected component. Such a deviation of VCI data may potentially be associated with any of multiple defect mechanisms (e.g. an isolated defect in a sublayer of the selected structure, a fault associated with a connected component, a short to a proximate structure, or the like). The controller 120 may utilize design data (e.g. netlist data, physical layout data, or the like) to identify the physical and/or electrical properties of neighboring structures to provide context for the interpretation of the higher than expected VCI signal. In this regard, the controller 120 may identify an electrically grounded neighboring structure in close proximity to the selected component.

Figure 5:
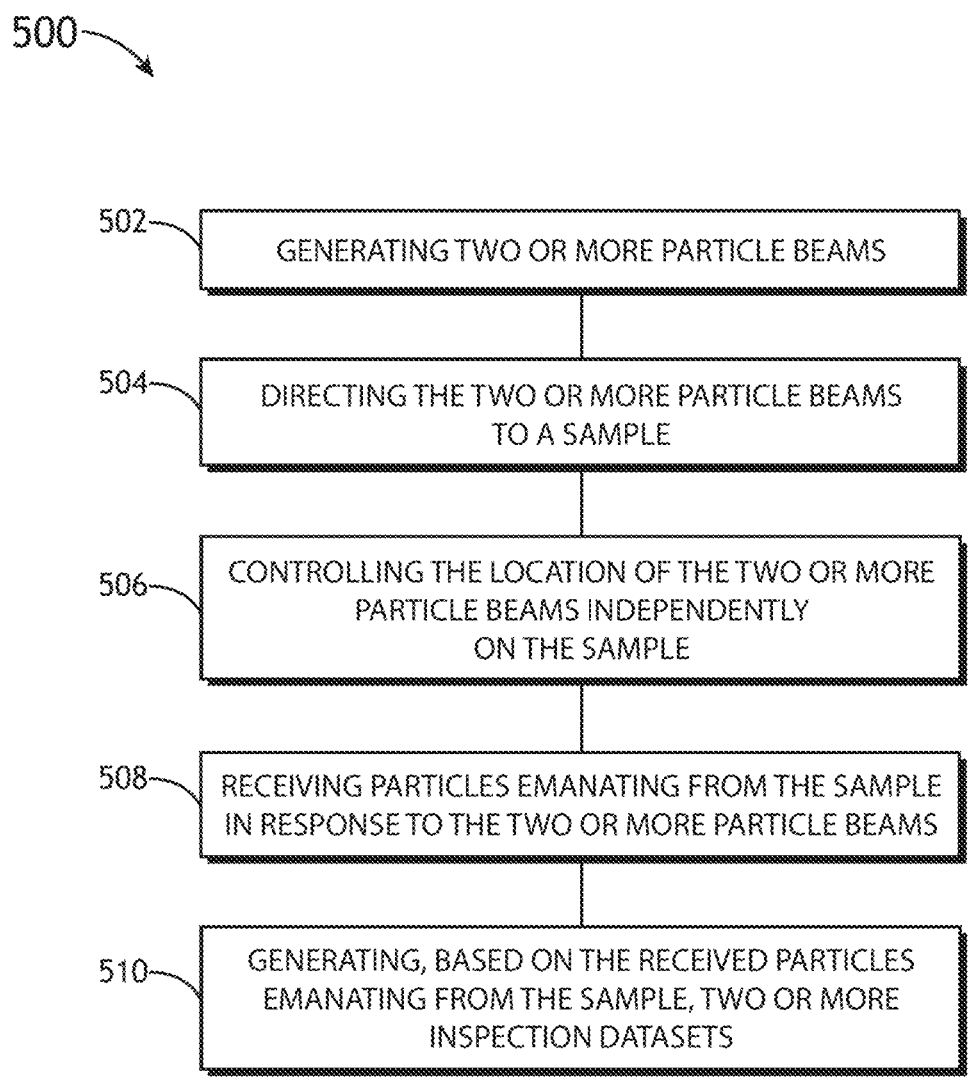
FIG. 5 is a flow diagram illustrating steps performed in a method for inspecting a sample, in accordance with one or more embodiments of the present disclosure.

FIG. 5 is a flow diagram illustrating steps performed in a method 500 for inspecting a sample, in accordance with one or more embodiments of the present disclosure. Applicant notes that the embodiments and enabling technologies described previously herein in the context of system 100 should be interpreted to extend to method 500. It is further noted, however, that the method 500 is not limited to the architecture of system 100.

In one embodiment, the method 500 includes a step 502 of generating two or more particle beams. For example, two or more particle beams may be generated by two or more particle guns (e.g. electron guns and/or ion guns). By way of another example, two or more particle beams may be generated using a single particle gun and an aperture having two or more openings. In this regard, a primary particle beam generated by the single particle gun may be incident on the aperture such that particles from the primary particle beam that propagate through the openings of the aperture define the two or more particle beams.

In another embodiment, the method 500 includes a step 504 of directing the two or more particle beams to a sample. For example, two or more particle beams may be combined by a beam combiner (e.g. a magnetic prism array, or the like) and directed to the sample. By way of another example, a set of particle focusing elements (e.g. electrostatic, magnetic, uni-potential, double-potential lenses, or the like) may adjust the spot size of each of the particle beams on the sample. In some embodiments, the two or more particle beams may be directed to the sample by an objective lens.

In another embodiment, the method 500 includes a step 506 of controlling the location of the two or more particle beams independently on the sample. For example, each of the two or more particle beams may be independently controlled by a set of beam scanning elements. In this regard, the beam steering elements, combined with the focusing characteristics of any particle focusing elements, may determine the location of a particular particle beam on the sample.

In another embodiment, the method 500 includes a step 508 of receiving particles emanating from the sample in response to the two or more particle beams. For example, particles emanating from the sample may be received by a detector. Accordingly, the detector may generate two or more data signals associated with the two or more particle beams. In another embodiment, particles emanating from the sample are collected by an objective lens prior to being directed to a detector. In this regard, the numerical aperture of collected particles may be controlled according to the focusing characteristics of the objective lens.

In another embodiment, the method 500 includes a step 510 of generating, based on the received particles emanating from the sample, two or more inspection datasets. For example, step 510 may include generating a separate dataset associated with particles emanating from the sample in response to each of the two or more particle beams. In this regard, each particle beam may be individually controlled to perform a separate function on the sample and/or to perform separate measurements.

Each of the steps of the method may be performed as described further herein. The steps may performed by one or more controllers (e.g., controller 120, or the like), which may be configured according to any of the embodiments described herein. In addition, the method described above may be performed by any of the system embodiments described herein. The method may also include one or more additional steps that may be performed by a controller or any system embodiments described herein.

Referring again to FIGS. 1A through 1C, in another embodiment, the detector 118 includes a light detector (e.g., a photon detector). For example, the detector 118 may include a photomultiplier tube (PMT). Further, the detector 118 may consist of a phosphor anode, which is energized by the cascaded electrons of the PMT detector absorbed by the anode and subsequently emits light. In turn, the light detector may collect light emitted by the phosphor anode in order to image the sample 108. The light detector may include any light detector known in the art, such as, but not limited to, a CCD detector or a CCD-TDI detector. In a general sense, it is recognized herein that the detector 118 may include any device or combination of devices known in the art for characterizing a sample surface or bulk with a particle beam 104. For example, the detector 118 may include any particle detector known in the art configured to collect backscattered electrons, Auger electrons, transmitted electrons or photons (e.g., x-rays emitted by surface in response to incident electrons, cathodoluminescence of the sample 108, or the like).

It is noted herein that the set of electron optics of system 100 as described above and illustrated in FIG. 1 are provided merely for illustration and should not be interpreted as limiting. It is anticipated that a number of equivalent or additional configurations may be utilized within the scope of the present invention. By way of a non-limiting example, one or more electron lenses or apertures may be positioned within the system 100. By way of an additional non-limiting example, the system 100 may include, but is not limited to, one or more electron deflectors, one or more apertures, one or more filters, or one or more stigmators. Further, although the system 100 is shown in FIGS. 1A through 1C as being configured such that the electrons are directed to the wafer at an oblique angle of incidence and are scattered from the wafer at another oblique angle, it is to be understood that the particle beams 104 may be directed to and scattered from the wafer at any suitable angles. In addition, the system 100 may be configured to use multiple modes to generate images of the wafer (e.g., with different illumination angles, collection angles, etc.).

In another embodiment, the controller 120 includes one or more processors 122. In another embodiment, the one or more processors 122 are configured to execute a set of program instructions maintained in a memory medium 124, or memory. The one or more processors 122 of a controller 120 may include any processing element known in the art. In this sense, the one or more processors 122 may include any microprocessor-type device configured to execute algorithms and/or instructions. In one embodiment, the one or more processors 122 may consist of a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory medium 124.

This controller 120 may also be referred to herein as one or more computer systems. Each of the computer subsystems or systems described herein may take various forms, including a personal computer system, image computer, mainframe computer system, workstation, network appliance, Internet appliance, or other device. In general, the term "computer system" may be broadly defined to encompass any device having one or more processors, which executes instructions from memory medium 124. The computer subsystems or systems may also include any suitable processor known in the art such as a parallel processor. In addition, the computer subsystems or systems may include a computer platform with high speed processing and software, either as a standalone or a networked tool.

If the system 100 includes more than one computer subsystem, then the different computer subsystems may be coupled to each other such that images, data, information, instructions, or the like may be sent between the computer subsystems as described further herein. For example, one computer subsystem may be coupled to an additional computer subsystem by any suitable transmission media, which may include any suitable wired and/or wireless transmission media known in the art. Two or more of such computer subsystems may also be effectively coupled by a shared computer-readable storage medium (not shown).

The memory medium 124 may include any storage medium known in the art suitable for storing program instructions executable by the associated one or more processors 122. For example, the memory medium 134 may include a non-transitory memory medium. As an additional example, the memory medium 124 may include, but is not limited to, a read-only memory, a random access memory, a magnetic or optical memory device (e.g., disk), a magnetic tape, a solid state drive, or any other suitable non-transitory computer-readable medium known in the art. Further, the program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

The memory medium 124 may be housed in a common controller housing with the one or more processors 122. In one embodiment, the memory medium 124 may be located remotely with respect to the physical location of the one or more processors 122 and controller 120. For instance, the one or more processors 122 of controller 120 may access a remote memory (e.g., server), accessible through a network (e.g., internet, intranet and the like). Therefore, the above description should not be interpreted as a limitation on the present invention but merely an illustration.

It is to be understood that the embodiments of the system 100 described herein and shown in FIGS. 1A through 1C may be modified to provide different inspection capabilities depending on the application for which the system 100 may be used. For example, the system 100 may be configured to have a higher resolution if it is to be used for defect review or metrology rather than for defect detection. In a general sense, the embodiments illustrated in FIGS. 1A through 1C describe some general and various configurations for an inspection system that can be tailored in a number of ways that will be obvious to one skilled in the art to produce sample inspection systems having different imaging capabilities that are more or less suitable for various applications.

Further, the system 100 may also be configured for inspection, defect review, and/or metrology of specimens such as wafers and reticles. For example, the embodiments described herein may be configured for using both scanning electron microscopy (SEM) and optical images (not shown) for the purposes of mask inspection, wafer inspection, and wafer metrology. In particular, the embodiments described herein may be installed on a computer node or computer cluster that is a component of or coupled to an output acquisition subsystem such as a broadband plasma inspector, an electron beam inspector or defect review tool, a mask inspector, a virtual inspector, etc. In this manner, the embodiments described herein may generate output datasets that may be used for a variety of applications that include, but are not limited to, wafer inspection, mask inspection, electron beam inspection and review, voltage contrast inspection, metrology, physical defect detection and/or classification, a root cause analysis of identified defects, or the like.

It is additionally noted that the systems described herein may be implemented using an existing system (e.g., by adding functionality described herein to an existing system) such as the eDR-xxxx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A multi-beam inspection system, comprising:
   one or more particle beam sources configured to generate two or more particle beams;
   a set of particle control elements configured to direct the two or more particle beams to independently selectable positions on a sample through a common focusing element, wherein the set of particle control elements are further configured to direct a first particle beam of the two or more particle beams to a first portion of the sample to emulate at least one of a voltage source or a current source, wherein the set of particle control elements is configured to concurrently direct one or more additional particle beams of the two or more particle beams across one or more additional portions of the sample, wherein the one or more additional portions of the sample include at least some structures electrically connected to the first portion of the sample;
   one or more detectors positioned to receive particles emanating from the sample in response to at least one of the two or more particle beams; and
   a controller communicatively coupled to the one or more detectors, the controller including one or more processors, the one or more processors configured to execute program instructions configured to cause the one or more processors to:
   generate one or more inspection datasets associated with the particles received by the one or more detectors, wherein at least one of the one or more inspection datasets is associated with at least one of the one or more additional portions of the sample.

2. The multi-beam inspection system of claim 1, wherein an inspection dataset of the one or more inspection datasets includes at least one of data associated with the physical layout of a sample surface, data associated with material properties of one or more layers of material on a sample, or data indicative of one or more physical defects identified on the sample.

3. The multi-beam inspection system of claim 1, wherein the one or more particle beam sources generate two or more particle beams having at least one of distinct particle energies, distinct particle energy densities, or distinct landing energies on the sample.

4. The multi-beam inspection system of claim 1, wherein the set of particle control elements comprises:
   at least one of a particle focusing element or a particle scanning element.

5. The multi-beam inspection system of claim 4, wherein the set of particle control elements are configured to direct the two or more particle beams to the sample with independently selectable spot sizes.

6. The multi-beam inspection system of claim 1, wherein at least one inspection dataset of the one or more inspection datasets includes imaging data associated with at least one of the one or more additional portions of the sample.

7. The multi-beam inspection system of claim 6, wherein the imaging data associated with at least one of the one or more additional portions of the sample includes voltage contrast imaging data associated with at least one of the one or more additional portions of the sample.

8. The multi-beam inspection system of claim 1, wherein the portion of the sample includes an alignment target.

9. The multi-beam inspection system of claim 8, wherein the alignment target includes an overlay target.

10. The multi-beam inspection system of claim 1, wherein the one or more particle beam sources include at least two particle beam sources.

11. The multi-beam inspection system of claim 10, wherein the one or more particle control elements include a dispersive element configured to combine the two or more particle beams to a common beam path.

12. The multi-beam inspection system of claim 11, wherein the dispersive element comprises:
   a magnetic prism array.

13. The multi-beam inspection system of claim 1, wherein the one or more particle beam sources include a single particle beam source.

14. The multi-beam inspection system of claim 13, further comprising:

an aperture having two or more openings configured to split a single particle beam from the single particle beam source into the two or more particle beams.

15. A multi-beam inspection system, comprising:
one or more particle beam sources configured to generate two or more particle beams including at least a first particle beam and a second particle beam;
a set of particle control elements configured to direct the first particle beam and the second particle beam to independently selectable positions on a sample through a common focusing element;
one or more detectors positioned to receive particles emanating from the sample in response to any of the two or more particle beams; and
a controller communicatively coupled to the one or more detectors, the controller including one or more processors, the one or more processors configured to execute program instructions configured to cause the one or more processors to:
direct the set of particle control elements to scan at least a portion of an alignment target on the sample with the first particle beam;
generate, based on the particles received by the one or more detectors, a first dataset associated with the alignment target;
determine one or more alignment metrics based on the first dataset;
direct, subsequent to scanning the at least a portion of the alignment target, the set of particle control elements to scan at least a portion of one or more structures on the sample with at least the second particle beam, wherein positions of the one or more structures are determined based on the one or more alignment metrics; and
generate, based on the particles received by the one or more detectors, a second dataset associated with the one or more structures on the sample.

16. The multi-beam inspection system of claim 15, wherein the one or more alignment metrics comprise:
at least one of a location or an orientation of the alignment target on the sample.

17. The multi-beam inspection system of claim 15, wherein the one or more alignment metrics comprise:
at least one of relative location data or relative orientation data of the one or more structures with respect to the alignment target.

18. The multi-beam inspection system of claim 15, wherein a dataset of at least one of the first data set or the second dataset includes at least one of data associated with the physical layout of a sample surface, data associated with material properties of one or more layers of material on a sample, or data indicative of one or more physical defects identified on the sample.

19. The multi-beam inspection system of claim 15, wherein the two or more particle beams have at least one of distinct particle energies, distinct particle energy densities, or distinct landing energies on the sample.

20. The multi-beam inspection system of claim 15, wherein the set of particle control elements comprises:
at least one of a particle focusing element or a particle scanning element.

21. The multi-beam inspection system of claim 20, wherein the set of particle control elements are configured to direct the first particle beam to the sample with a first spot size and the second particle beam to the sample with a second spot size different than the first spot size.

22. The multi-beam inspection system of claim 15, wherein the one or more processors are further configured to execute program instructions to cause the one or more processors to:
direct, subsequent to scanning the at least a portion of the alignment target, a particle beam of the two or more particle beams to a first position on the sample to emulate at least one of a voltage source or a current source, wherein at least one structure in the second portion of the sample is electrically connected to the first portion of the sample, wherein the second dataset is influenced by the at least one of the voltage source or the current source emulated by the first particle beam.

23. The multi-beam inspection system of claim 22, wherein the two or more particle beams includes a third particle beam, wherein the particle beam of the two or more particle beams directed to the first position on the sample is the third particle beam.

24. The multi-beam inspection system of claim 22, wherein at least one of the first dataset or the second dataset includes imaging data of the second portion of the sample.

25. The multi-beam inspection system of claim 24, wherein the imaging data of the sample includes voltage contrast imaging data of the sample.

26. The multi-beam inspection system of claim 15, wherein the alignment target includes an overlay target.

27. The multi-beam inspection system of claim 18, wherein the one or more particle beam sources include two particle beam sources.

28. The multi-beam inspection system of claim 18, wherein the one or more particle control elements include a dispersive element configured to combine the two particle beams to a common beam path.

29. The multi-beam inspection system of claim 28, wherein the dispersive element comprises:
a magnetic prism array.

30. The multi-beam inspection system of claim 18, wherein the one or more particle beam sources include a single particle beam source.

31. The multi-beam inspection system of claim 30, further comprising:
an aperture having two openings configured to split a single particle beam from the single particle beam source into the two particle beams.

32. A method for sample inspection, comprising:
generating two or more particle beams;
directing a first particle beam of the two or more particle beams to a first portion of the sample to emulate at least one of a voltage source or a current source;
scanning, concurrent to directing the first particle beam, a second particle beam of the two or more particle beams across a second portion of the sample different than the first portion, wherein at least one structure in the second portion of the sample is electrically connected to the first portion of the sample;
receiving particles emanating from the sample in response to the two or more particle beams; and
generating, based on the received particles emanating from the sample, one or more inspection datasets associated with the received particles emanating from the sample, wherein at least one of the one or more inspection datasets is associated with the second portion of the sample and is indicative of an influence of the at least one of the voltage source or the current source emulated by the first particle beam on the second portion of the sample.

33. The method for sample inspection of claim 32, further comprising:
controlling spot sizes of the two or more particle beams independently on the sample.

34. The method for sample inspection of claim 32, further comprising:
controlling particle energies of the two or more particle beams independently on the sample.

35. The method for sample inspection of claim 32, further comprising:
controlling particle energy densities of the two or more particle beams independently on the sample.

36. The method for sample inspection of claim 32, further comprising:
controlling landing energies of the two or more particle beams independently on the sample.

37. The method for sample inspection of claim 32, wherein an inspection dataset of the one or more inspection datasets includes at least one of data associated with the physical layout of a sample surface, imaging data associated with the second portion of the sample, data associated with material properties of one or more layers of material on a sample, or data indicative of one or more physical defects identified on the sample.

38. A multi-beam inspection system, comprising:
one or more particle beam sources configured to generate two or more particle beams;
a set of particle control elements configured to direct the two or more particle beams to independently selectable positions on a sample through a common focusing element, wherein the set of particle control elements are further configured to direct a first particle beam of the two or more particle beams to a first portion of the sample to emulate at least one of a voltage source or a current source, wherein the set of particle control elements are configured to concurrently scan a second particle beam of the two or more particle beams across a second portion of the sample different than the first portion, wherein at least one structure in the second portion of the sample is electrically connected to the first portion of the sample;
one or more detectors positioned to receive particles emanating from the sample in response to the two or more particle beams; and
a controller communicatively coupled to the one or more detectors, the controller including one or more processors, the one or more processors configured to execute program instructions configured to cause the one or more processors to:
generate one or more inspection datasets associated with the particles received by the one or more detectors, wherein an inspection dataset of the one or more inspection datasets associated with the second particle beam includes imaging data of the second portion of the sample influenced by the at least one of the voltage source or the current source emulated by the first particle beam.

39. The multi-beam inspection system of claim 1, wherein the second portion of the sample is different than the first portion of the sample.

40. The multi-beam inspection system of claim 1, wherein the independently selectable positions of the two or more particle beams include at least a common position on the sample.

41. The multi-beam inspection system of claim 1, wherein at least one of the inspection datasets associated with the second particle beam includes imaging data of the second portion of the sample influenced by the at least one of the voltage source or the current source emulated by the first particle beam.

* * * * *